United States Patent
Yau et al.

(12)
(10) Patent No.: US 6,498,520 B1
(45) Date of Patent: Dec. 24, 2002

(54) MINIMIZING THE EFFECT OF CLOCK SKEW IN PRECHARGE CIRCUIT

(75) Inventors: Tao-ying Yau, Cupertino, CA (US); Ping Wang, Saratoga, CA (US); Xiaozhen Guo, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/973,326

(22) Filed: Oct. 9, 2001

(51) Int. Cl.<sup>7</sup> ............................................. H03B 1/00
(52) U.S. Cl. ...................................... 327/108; 365/203
(58) Field of Search ............................. 327/108, 112; 365/185.25, 203, 204; 326/93, 95, 96, 97, 98

(56) References Cited

U.S. PATENT DOCUMENTS 6,018,487 A * 1/2000 Lee et al. .................. 365/104
6,233,186 B1 * 5/2001 Tonda .................. 365/185.21
6,304,491 B2 * 10/2001 Johnson et al. ........ 365/189.01
6,331,793 B1 * 12/2001 Fletcher et al. ............... 327/51

* cited by examiner

*Primary Examiner*—Kenneth B. Wells
*Assistant Examiner*—Linh Nguyen
(74) *Attorney, Agent, or Firm*—Rosenthal & Osha L.L.P.

(57) ABSTRACT

A system for minimizing the effect of clock skew in a precharge circuit includes a switch coupled between an input to the precharge circuit and a global bitline; and a control circuit coupled to a precharge component and the switch. The control circuit determines whether the switch and the precharge component are activated and the control circuit receives feedback from the switch. A method of minimizing the effect of clock skew in a precharge circuit includes controlling whether an input signal outputting a first signal and a second signal from the precharge circuit; controlling the outputting of the second signal from the precharge circuit based on a clock signal, a select signal, and a dynamic signal.

20 Claims, 14 Drawing Sheets

MINIMIZING THE EFFECT OF CLOCK SKEW IN PRECHARGE CIRCUIT

BACKGROUND OF INVENTION

In computer and information processing systems, various integrated circuit chips must communicate digitally with each other over common buses. The receiving bus nodes recognize the signal as being high or low using receivers, also referred to as input buffers. Often the receiver is a differential receiver, i.e., a receiver that detects the difference between two input signals, referred to as the differential inputs. These input signals may be a received signal and a reference voltage or they may be a received signal and the inverse of the received signal. In either case, it is the difference between the two input signals that the receiver detects in order to determine the state of the received signal.

Integrated circuits are powered at certain voltage levels, which levels are then provided to the various components, such as the receivers, which are located on the integrated circuit. However, the nominal supply voltage for integrated circuits keeps being decreased to reduce power consumption. Additionally, fluctuations of the voltage level during operation can make the voltage level powering a receiver even lower. The lower the supply voltage, the more challenging it is to get a receiver to operate reliably.

The signal frequency at which communication occurs can limit the performance of the overall system. Thus, the higher the communication frequency, the better. The maximum frequency at which a system communicates is a function not only of the time that it takes for the electromagnetic wavefronts to propagate on the bus from one chip to another, but also of the time required for the signals to be reliably recognized at the receiving bus nodes as being high or low. Characteristics that affect the time in which a signal is recognized by a receiver include the set up time of the receiver, i.e., the amount of time before a clock edge that a signal must arrive and settle to a recognized level, and the hold time of the receiver, i.e., the time that the received signal must stay at a certain level in order for that level to be detected by the receiver.

Other characteristics that affect the ability of the receiver to determine that state of the received signal include the ability of the receiver to reject input noise and power supply noise and sensitivity, i.e., the ability of the receiver to resolve small voltage differences between the differential inputs of the receiver. There are many kinds of receivers, inverters, differential amplifiers, and sense amplifiers. Sense amplifier type input receivers have the advantage of good sensitivity, i.e., almost zero setup time and a specific hold time. These features improve timing for high speed I/O interfaces.

Figure 1:
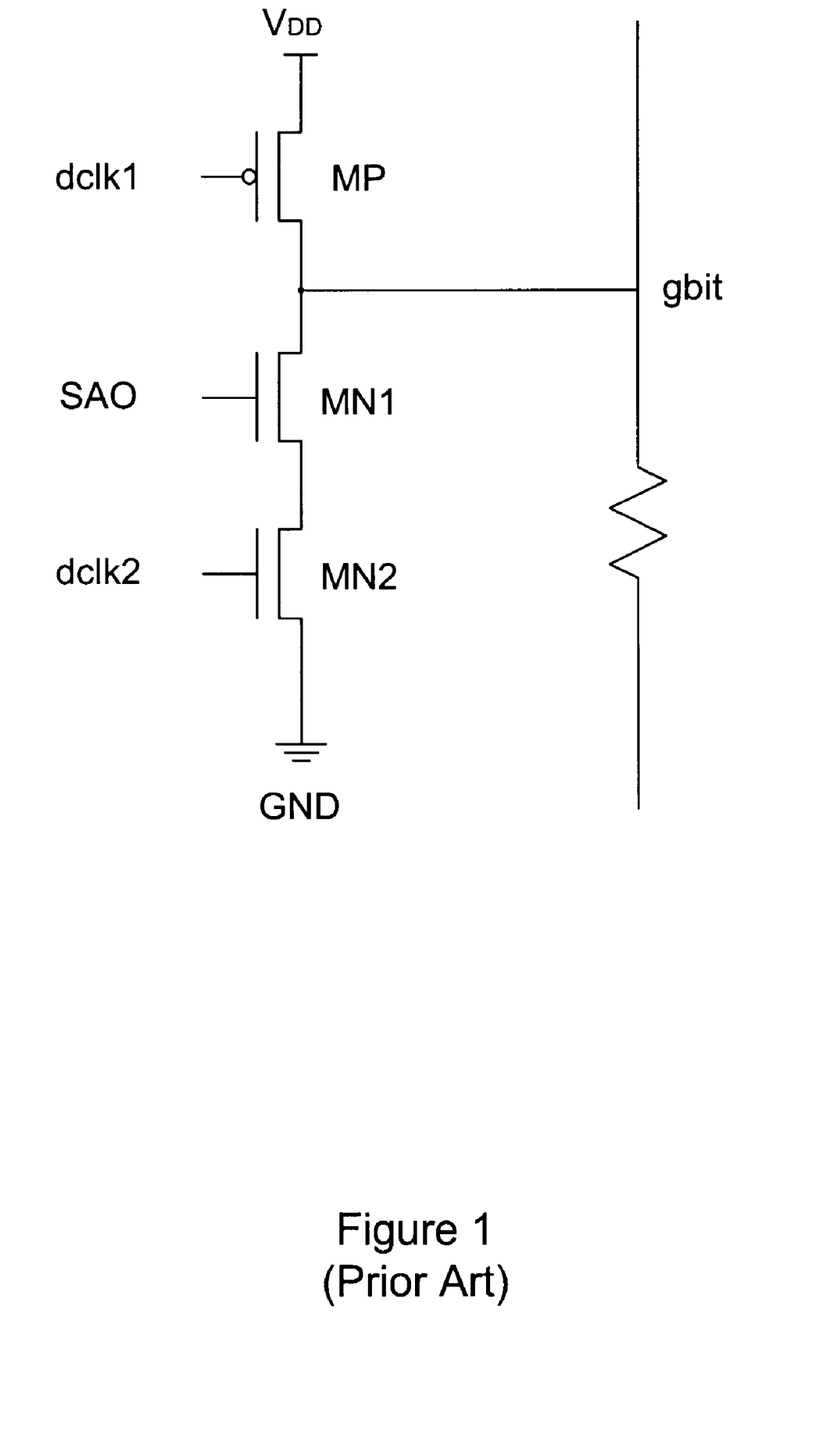
FIG. 1 shows a block diagram of a prior art driving stage with a footer device.

Output from a sense amplifier, or other clock-like signal, is delivered to a global bitline through a driving stage as shown in FIG. 1. The sense amplifier output (sao) fed into an nmos transistor (MN1) coupled between another nmos transistor and a pmos transistor. The pmos transistor (MP) is coupled to Vcc and receives the delayed clock signal 1 (dclk1). The nmos transistor (MN2) is coupled to ground (GND) and receives the delayed clock signal 2 (dclk2). The global bitline (gbit) is coupled to the driving stage between the pmos transistor (MP) and the nmos transistor (MN1). The sense amplifier output is derived on the high to low transition of the clock signal (clk), i.e., the b-phase. However, the sense amplifier output (sao) may change so slowly that the clock signal (clk) has transitioned low to high, i.e., the a-phase, before the change occurs.

Those skilled in the art will appreciate that when a driver and precharge of a signal is driven by different signals, the driver has to turn off before the precharge begins and precharge has to end before the driver turns on. If not, crowbar current will flow between the precharge and driver transistors, and the output may not be driven or precharged to rail voltages. Thus, clock skew has to be accounted for in order to avoid these conditions.

The above configuration is commonly known as a footer device scheme because it includes the pull down transistor (MN2). In a footer device scheme, in order to attain the same drive strength as a non-footer scheme, the driver device size has to increase. Further, the footer device increases the clock loading.

If there are multiple drivers and precharge on the same signal (wired-or structure), with the drivers and precharges driven by more than one clock grid, the clock skew may become so large that the window for driving and precharge of the signal becomes very narrow. To compensate for this narrowed window, the driver and precharge transistor sizes often is increased. Even then, at some point, the return is diminished because the increased diffusion capacitance of the now larger transistors causes self-loading on the signal. Thus, regardless of how large the transistors sizes are increased thereafter, the signal does not speed up.

SUMMARY OF INVENTION

In general, in one aspect, a system for minimizing the effect of clock skew in a precharge circuit comprises a switch coupled between an input to the precharge circuit and a global bitline; and a control circuit coupled to a precharge component and the switch. The control circuit determines whether the switch and the precharge component are activated and the control circuit receives feedback from the switch.

In general, in one aspect, a method of minimizing the effect of clock skew in a precharge circuit comprises controlling whether an input signal outputting a first signal and a second signal from the precharge circuit; controlling the outputting of the second signal from the precharge circuit based on feedback of the first signal; and controlling the outputting of the first signal from the switch based on a clock signal, a select signal, and a dynamic signal.

In general, in one aspect, an apparatus for minimizing the effect of clock skew in a precharge circuit comprises means for controlling whether an input signal outputting a first signal and a second signal from the precharge circuit; means for controlling the outputting of the second signal from the precharge circuit based on feedback of the first signal; and means for controlling the outputting of the first signal from the switch based on a clock signal, a select signal, and a dynamic signal.

In general, in one aspect, a system for minimizing the effect of clock skew in a precharge circuit comprises a switch coupled between input to the precharge circuit and a global bitline; and a control circuit coupled to a precharge component and the switch. The control circuit determines whether the switch and the precharge component are activated, the control circuit receives feedback from the switch, and the precharge component receives feedback from the switch and the global bitline.

In general, in one aspect, a system for minimizing the effect of clock skew in a precharge circuit comprises a switch coupled between a first input to the precharge circuit and a global bitline and a second input to the precharge circuit and a global bitline; a first control circuit coupled to a precharge component and the switch, and a second control circuit coupled to a precharge component and the switch. The first control circuit determines whether the switch and the precharge component are activated for the first input, the second control circuit determines whether the switch and the precharge component are activated for the second input, the first control circuit receives feedback from the switch, the second control circuit receives feedback from the switch, and the precharge component receives feedback from the switch and the global bitline.

Other aspects and advantages of the invention will be apparent from the following description and the appended claims.

DETAILED DESCRIPTION

Figure 2:
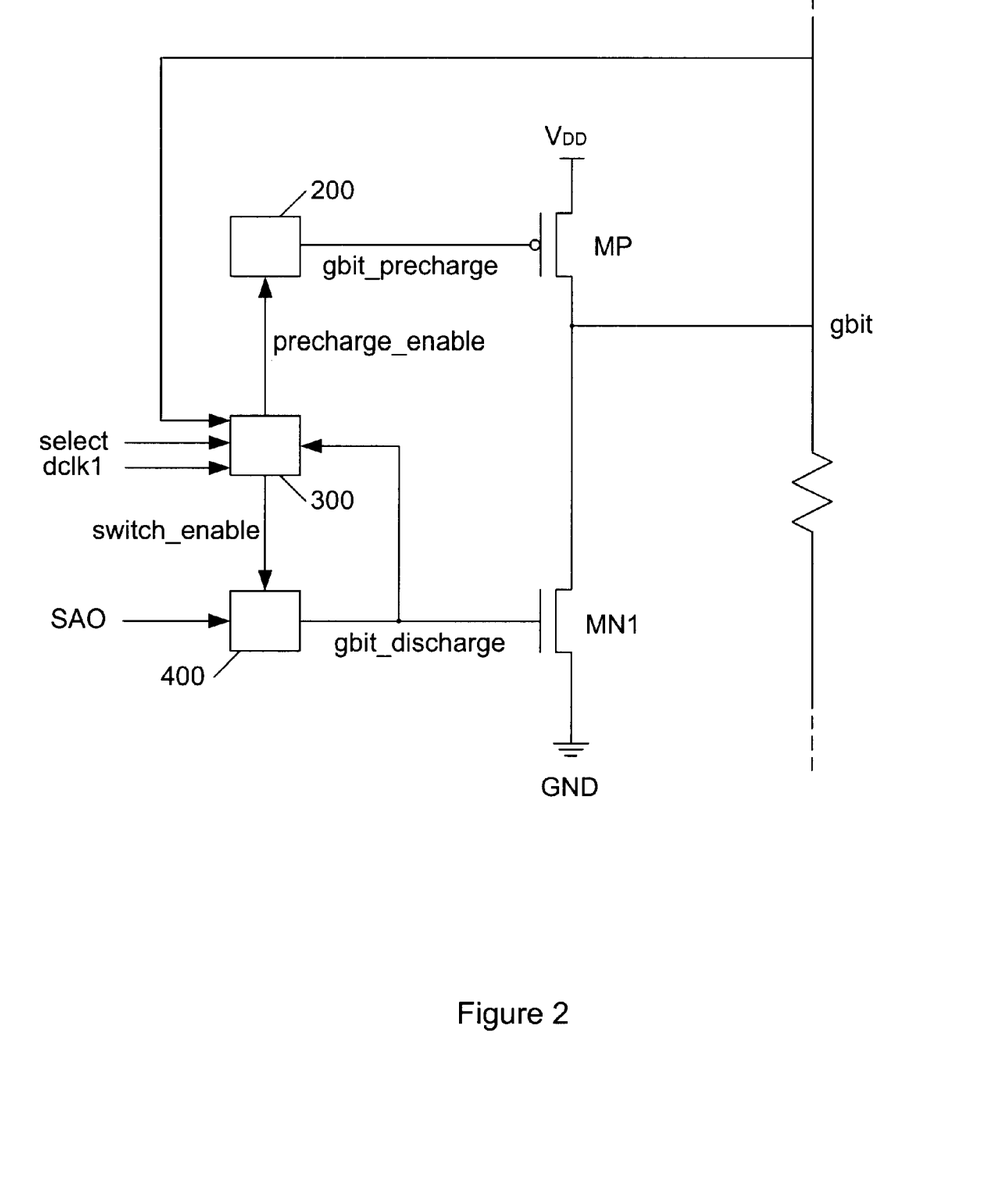
FIG. 2 shows a block diagram of a circuit in accordance with one or more embodiments of the present invention.

Generally, in one or more embodiments, the invention involves minimizing the effect of clock skew in a precharge circuit. Referring to the drawings wherein like reference characters are used for like parts throughout the several views, FIG. 2 shows a block diagram of a circuit in accordance with an embodiment of the present invention.

In the embodiment shown, a p-channel transistor (MP) is connected drain to drain with an n-channel transistor (MN1). The p-channel transistor (MP) is connected to supply voltage ($V_{DD}$) at the source and the n-channel transistor (MN1) is connected source to ground (GND). The gate of the p-channel transistor (MP) is connected to a precharge circuit (200). The gate of the n-channel transistor is connected to a control circuit (300) and a switch (400). The control circuit (300) also receives a control input signal (select), a clock signal (dclk1), and feedback from the global bitline (gbit). The control circuit (300) outputs a precharge control signal (precharge_enable) to the precharge component (200) and a switch control signal (switch_enable) to the switch (400). Switch (400) also receives the sense amplifier output (SAO). Those skilled in the art will appreciate that while a sense amplifier output (SAO) is used throughout the description, the present invention applies generally to any dynamic output signal, i.e., one that is asserted upon being triggered and is reset by a clock.

As will be discussed in further detail with reference to FIGS. 3–5, when the clock signal (dclk1) is low and the control signal (select) is asserted, the output of the control circuit (300) activates the switch (400) through switch control signal (switch_enable), thereby allowing the sense amplifier output (SAO) to pass. The switch is enabled until the sense amp output transitions high and the clock transitions high, or until the next low going edge of the clock, at which time, the switch continues to be enabled if the control signal (select) is asserted. Otherwise, if the control signal (select) is not asserted, the switch is disabled. When the switch is enabled and the sense amplifier output (SAO) goes high, the signal (SAO) passes through the switch (400) and causes the global bitline discharge control signal (gbit_discharge) to also transition to high. This discharges the global_bitline (gbit), i.e., the global bitline (gbit) is pulled low, and at the same time the global bitline discharge control signal (gbit_discharge) sets a latch in the control circuit (300).

Next, the later of the clock signal (dclk1) transitioning to high or global bitline discharge control signal (gbit_discharge) transitioning to high causes the control circuit (300) to turn off the switch (400). When the switch (400) is turned off, the global bitline discharge control signal (gbit_discharge) is forced low. Thereafter, the precharge control signal (precharge_enable) is asserted and precharge component (200) asserts a global bitline precharge signal (gbit_precharge) through p-channel transistor (MP) and begins precharge. Precharge stops once the global bitline (gbit) is precharged to high and the clock signal (dclk1) is low. This process repeats for each discharge and precharge of the global bitline (gbit).

Figure 3:
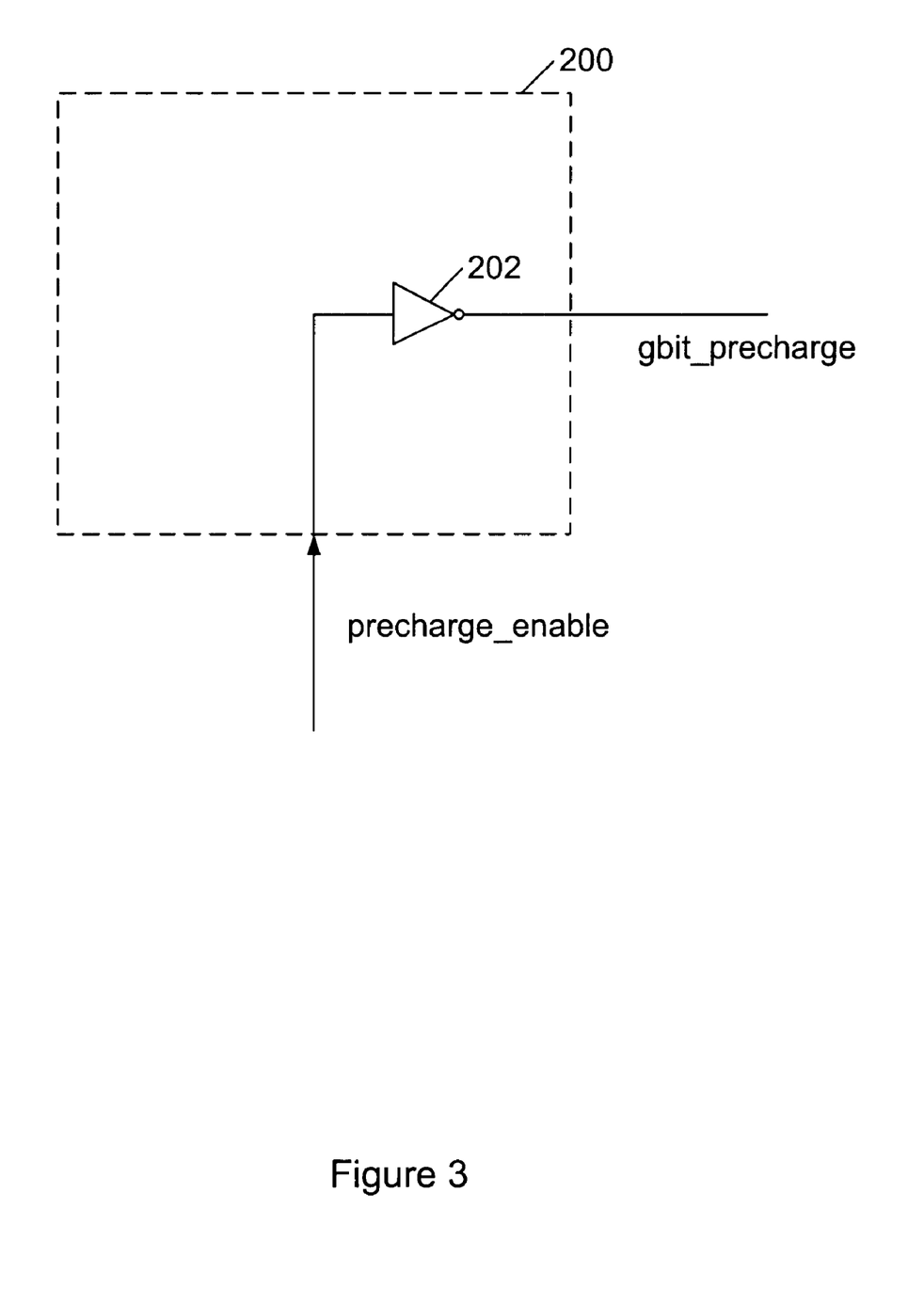
FIG. 3 shows a circuit diagram of a precharge circuit in accordance with one or more embodiments of the present invention.

Referring to FIG. 3, in one embodiment, the precharge component (200) is an inverter (202) connecting the precharge control signal (precharge_enable) to the p-channel transistor (MP). In such a case, the global bitline precharge control signal (gbit_precharge) is the complement of the precharge control signal (precharge_enable).

Figure 4:
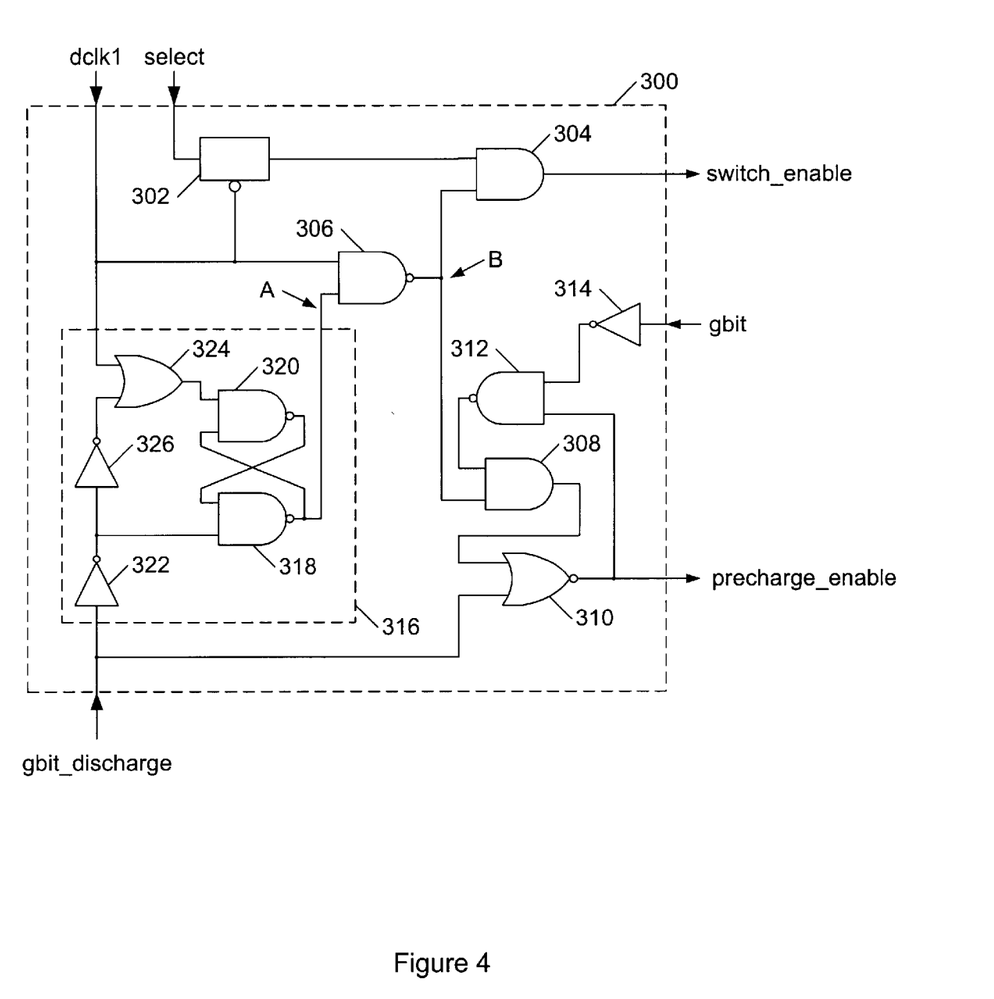
FIG. 4 shows a circuit diagram of a control circuit in accordance with one or more embodiments of the present invention.

Referring to FIG. 4, control circuit (300) includes a latch (302), which samples the control input signal (select) when the clock signal is low, and connects to an input of AND gate (304). The clock signal (dclk1) is connected to the control of the latch (302) and a NAND gate (306). The output of the NAND gate (306) is connected to the other input of AND gate (304). The output of AND gate (304) is output from the control circuit (300) as the switch control signal (switch_enable). The output of NAND gate (306) is also connected to the input of AND gate (308). The output of the AND gate (308) connects to one of the inputs of NOR gate (310). The output of the NOR gate (310) outputs from the control circuit (300) as the precharge control signal (precharge_enable). The output of the NOR gate (310) is also connected to the input of NAND gate (312). The output of the NAND gate (312) is fed to the other input of AND gate (308). The global bitline (gbit) is connected through an inverter (314) to the other input of NAND gate (312).

The clock signal (dclk1) is also connected to a glitch latch (316), which, in turn, is coupled to the other input of the NAND gate (306). As shown, the glitch latch (316) may include a pair of cross-coupled NAND gates (318, 320). The output of the glitch latch (316) is derived from the output of NAND gate (318), which receives at the other input the complement of the global bitline discharge control signal (gbit_discharge). The complement of the global bitline discharge control signal (gbit_discharge) is obtained by passing the signal (gbit_discharge) through inverter (322). The other input of NAND gate (320) receives the output of OR gate (324). The clock signal (dclk1) feeds into one input of OR gate (324) and the global bitline discharge control signal (gbit_discharge) feeds into the other input of OR gate (324). In the shown embodiment, the global bitline discharge control signal (gbit_discharge) is obtained by passing the complement derived from inverter (322) through an inverter (326). Those skilled in the art will appreciate that any latch that converts a dynamic signal to a static signal can be used for glitch latch (316).

As can be seen, in the embodiment shown, the control input signal (select) is included so that the global bitline discharge control signal (gbit_discharge) can be forced low by setting the control input signal (select) to low. Further, with regard to the operation of the circuit, when the clock signal (dclk1) is low and the control input signal (select) is high, the switch control signal (switch_enable) is high. The switch control signal (switch_enable) being high activates switch (400).

Node A is reset to low when the clock signal is low because the global bitline discharge control signal (gbit_discharge) is low. Then, when the global bitline discharge control signal (gbit_discharge) transitions to high, Node A goes high, which causes Node B to transition to low when the clock is high. When Node B goes low, the switch control signal (switch_enable) is transitioned to low, which turns off switch (400). The turning off of switch (400) causes the global bitline discharge control signal (gbit_discharge) to transition to low. Once Node B and the global bitline discharge control signal (gbit_discharge) are low, the precharge control signal (precharge_enable) is asserted and precharge begins. Then, when the clock signal (dclk1) transitions to low, Node B is set high. If Node B and the global bitline (gbit) are set high, then the precharge control signal (precharge_enable) goes low.

Figure 5:
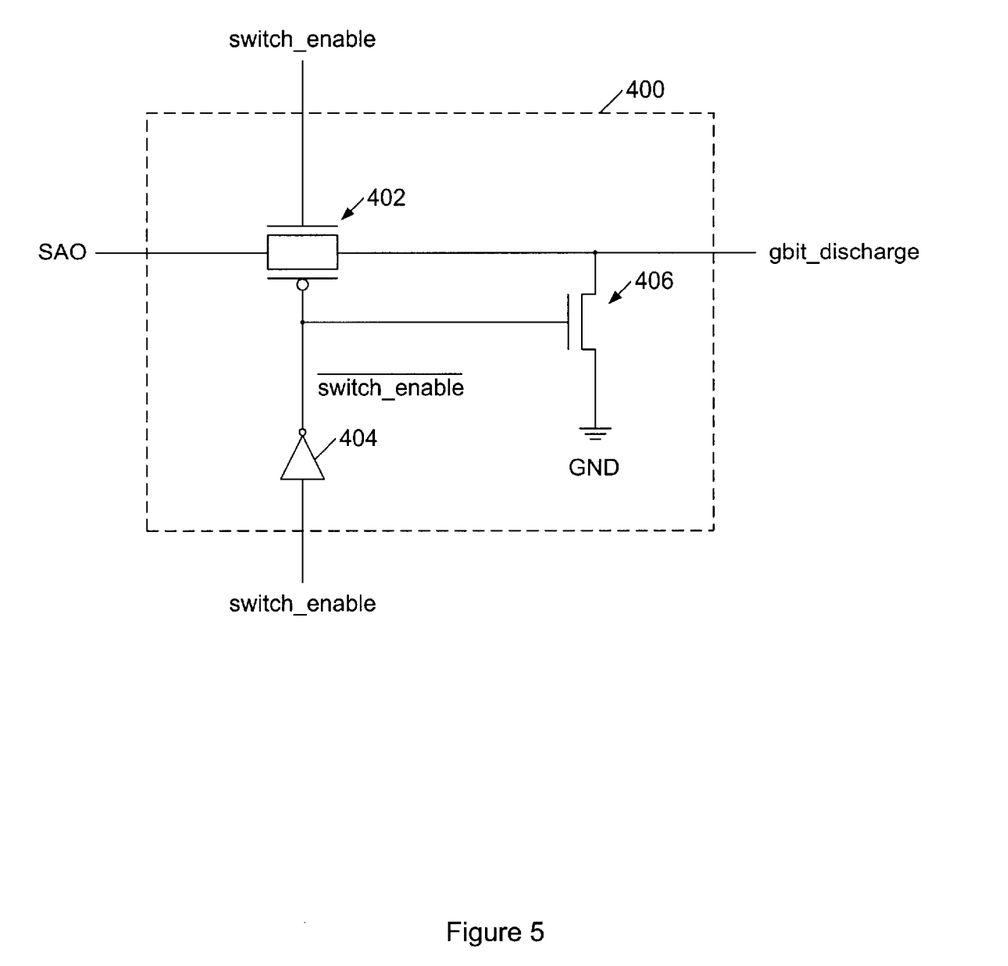
FIG. 5 shows a circuit diagram of a switch in accordance with one or more embodiments of the present invention.

Referring to FIG. 5, in one embodiment, switch (400) includes a pass gate (402), which controls the passing of the sense amplifier output (SAO) to the global bitline discharge control signal (gbit_discharge). The pass gate is controlled by the switch control signal (switch_enable) and the complement of the switch control signal (switch_enable). The complement of the switch control signal (switch_enable) is obtained through inverter (404). Also, an n-channel transistor (406) is connected at the gate to the output of inverter (404) and the control of the pass gate (402). The n-channel transistor (406) is also coupled at the source to ground (GND) and at the drain to the output side of the pass gate (402).

Figure 6:
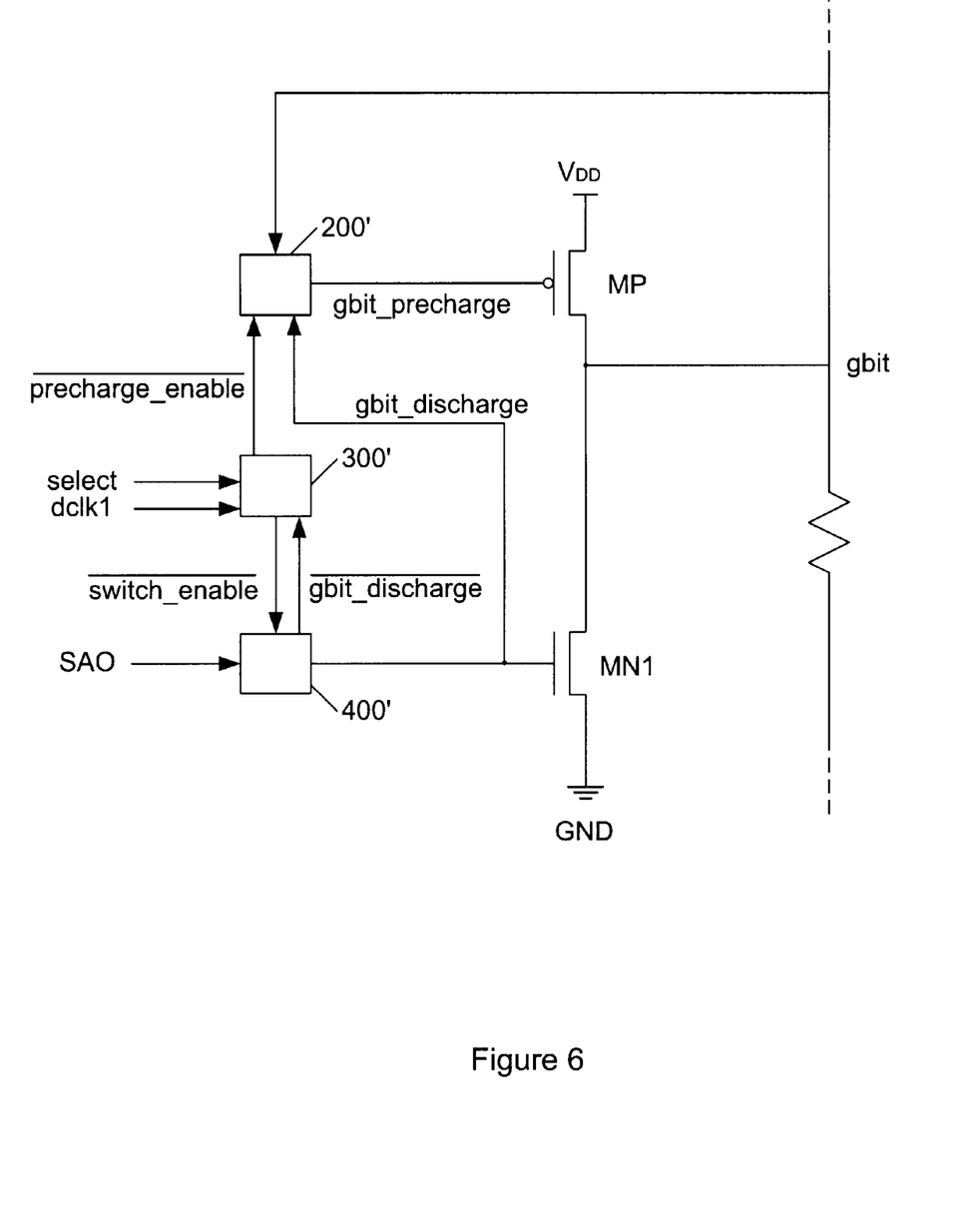
FIG. 6 shows a block diagram of a circuit in accordance with one or more embodiments of the present invention.

Referring to FIGS. 6–9, in one or more embodiments, the present invention may involve other configurations. For example, FIG. 6 shows an embodiment in which the global bitline (gbit) feedback is provided to the precharge component (200'). Also, the global bitline discharge control signal (gbit_discharge) is fed into the precharge component (200').

Figure 7:
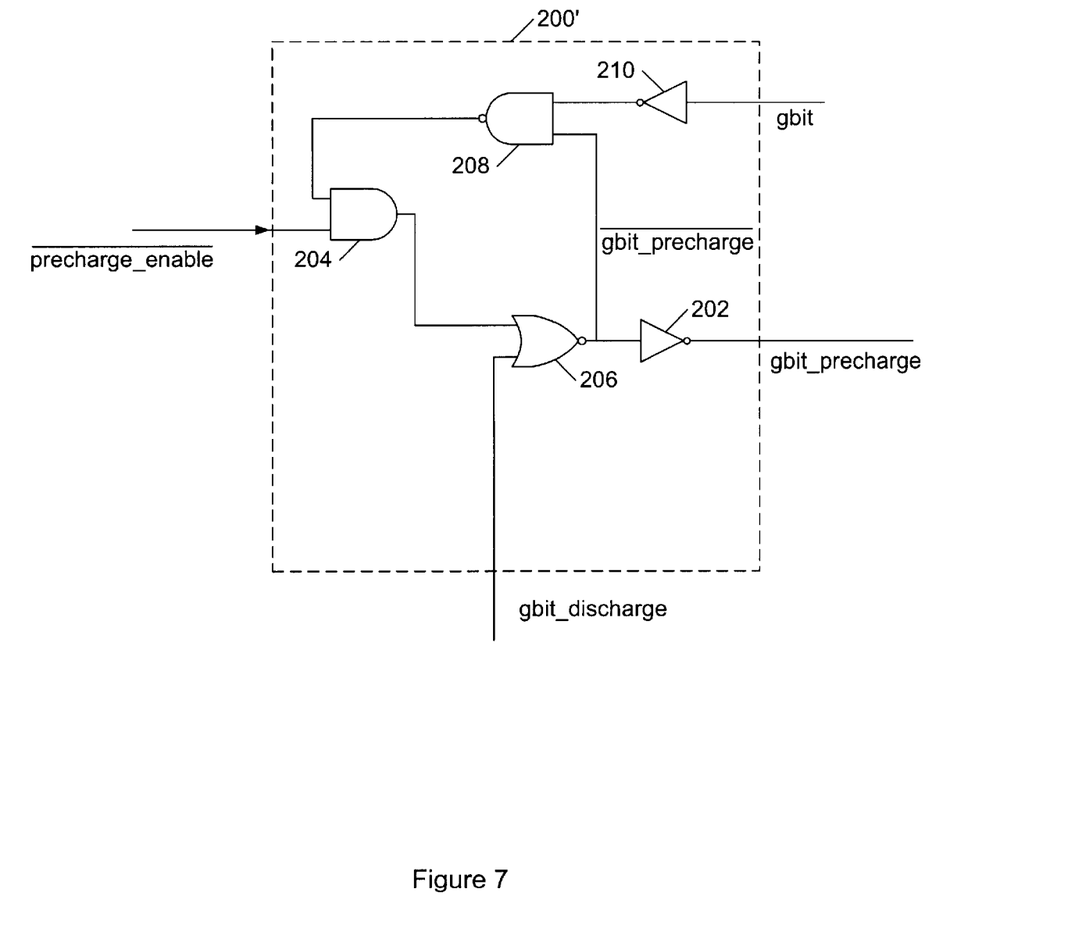
FIG. 7 shows a circuit diagram of a precharge circuit in accordance with one or more embodiments of the present invention.

Referring t6 FIG. 7, precharge component (200') that includes an inverter (202) connected to the p-channel transistor (MP). In this embodiment, however, there also are additional components, AND gate (204), NOR gate (206), NAND gate (208), and inverter (210).

These components are arranged such that the global bitline (gbit) is fed back through inverter (210) into one of the terminals of NAND gate (208). The output of NOR gate (206) produces the complement of the global bitline precharge signal (gbit_precharge), which is sent to the global bitline (gbit) after being inverted by inverter (202). The other terminal of NAND gate (208) also receives the complement of the global bitline precharge control signal (gbit_precharge) that is also fed into inverter (202). The output of NAND gate (208) is connected to one of the input terminals of AND gate (204). The other input terminal of AND gate (204) receives the complement of the global bitline precharge_enable signal (gbit_precharge) supplied from control circuit (300'). The output of AND gate (204) is fed into one of the terminals of NOR gate (206). The other input of NOR gate (206) receives the global bitline discharge control signal (gbit_discharge) from switch (400').

Figure 8:
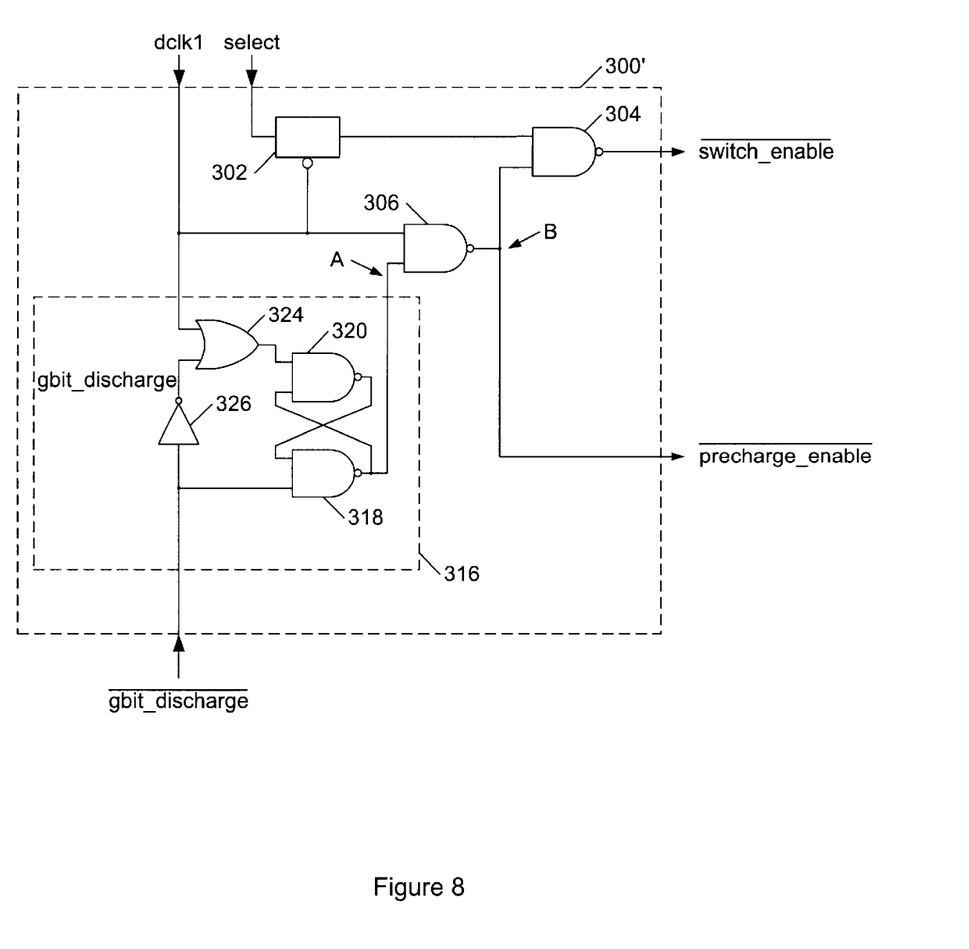
FIG. 8 shows a circuit diagram of a control circuit in accordance with one or more embodiments of the present invention.

Referring to FIG. 8, in this embodiment, control circuit (300') includes a latch (302), which samples the control input signal (select) when the clock is low, connected to an input of NAND gate (304). The clock signal (dclk1) is connected to the control of the latch (302) and a NAND gate (306). The output of the NAND gate (306) is connected to the other input of NAND gate (304). The output of NAND gate (304) is output from the control circuit (300') as the complement of the switch control signal (switch_enable). The output of NAND gate (306) is sent from the control circuit (300') as the complement of the precharge control signal (precharge_enable).

The clock signal (dclk1) is also connected to a glitch latch (316), which, in turn, is coupled to the other input of the NAND gate (306). As shown, in this embodiment, the glitch latch (316) includes a pair of cross-coupled NAND gates (318, 320). The output of the glitch latch (316) is derived from the output of NAND gate (318), which receives at the other input the complement of the global bitline discharge control signal (gbit_discharge). The complement of the global bitline discharge control signal (gbit_discharge) is provided from switch (400'). The other input of NAND gate (320) receives the output of OR gate (324). The clock signal (dclk1) feeds into one input of OR gate (324) and the global bitline discharge control signal (gbit_discharge) feeds into the other input of OR gate (324). In the shown embodiment, the global bitline discharge control signal (gbit_discharge) is obtained by passing the complement through an inverter (326). Those skilled in the art will appreciate that any latch that converts a dynamic signal to a static signal can be used for glitch latch (316).

Figure 9:
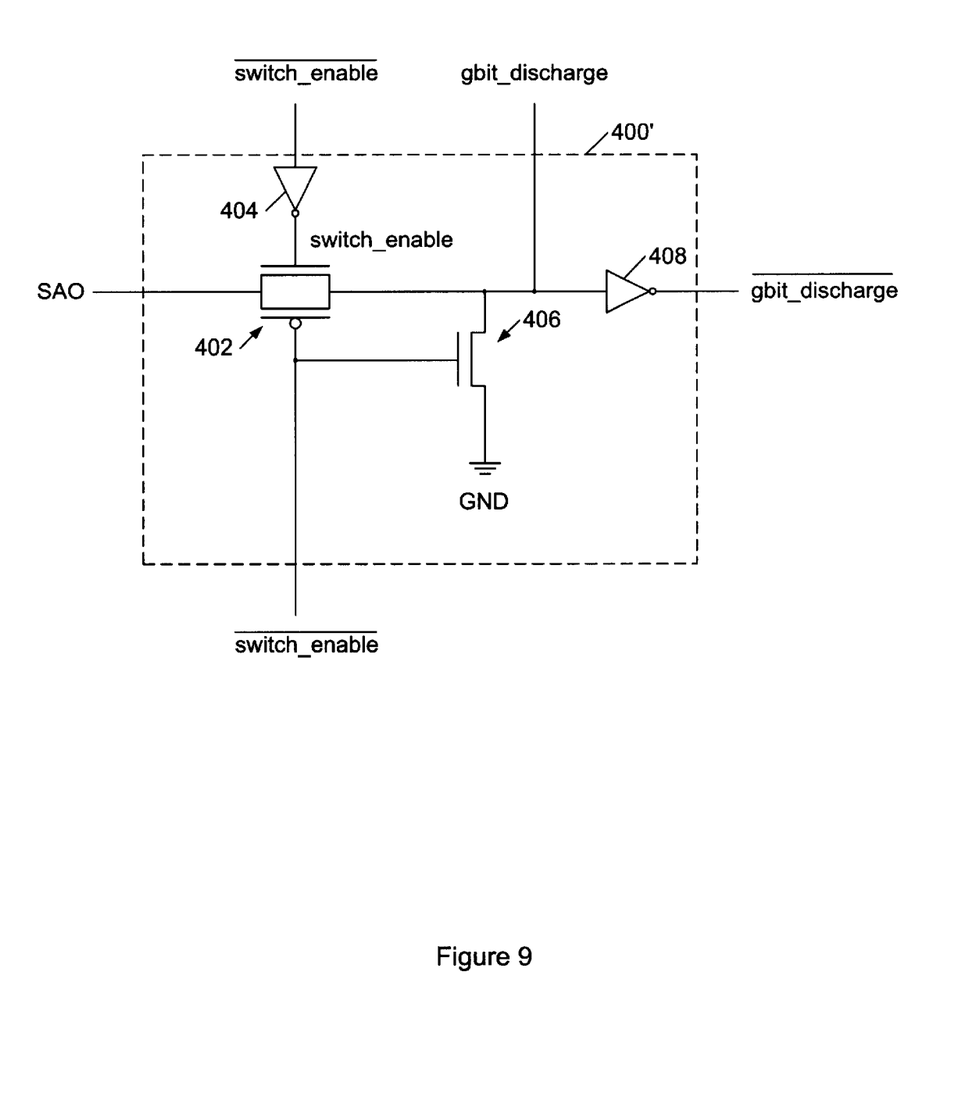
FIG. 9 shows a circuit diagram of a switch in accordance with one or more embodiments of the present invention.

Referring to FIG. 9, switch (400') includes a pass gate (402), which controls the passing of the sense amplifier output (SAO) to the global bitline discharge control signal (gbit_discharge). The pass gate is controlled by the switch control signal (switch_enable) and the complement of the switch control signal (switch_enable). The switch control signal (switch_enable) is obtained through inverter (404). An n-channel transistor (406) is connected at the gate to the complement of the switch control signal (switch_enable) and the control of the pass gate (402). The n-channel transistor (406) is also coupled at the source to ground (GND) and at the drain to the output side of the pass gate (402). Also, an inverter (408) is included for producing the complement of the global bitline discharge control signal (gbit_discharge).

Figure 10:
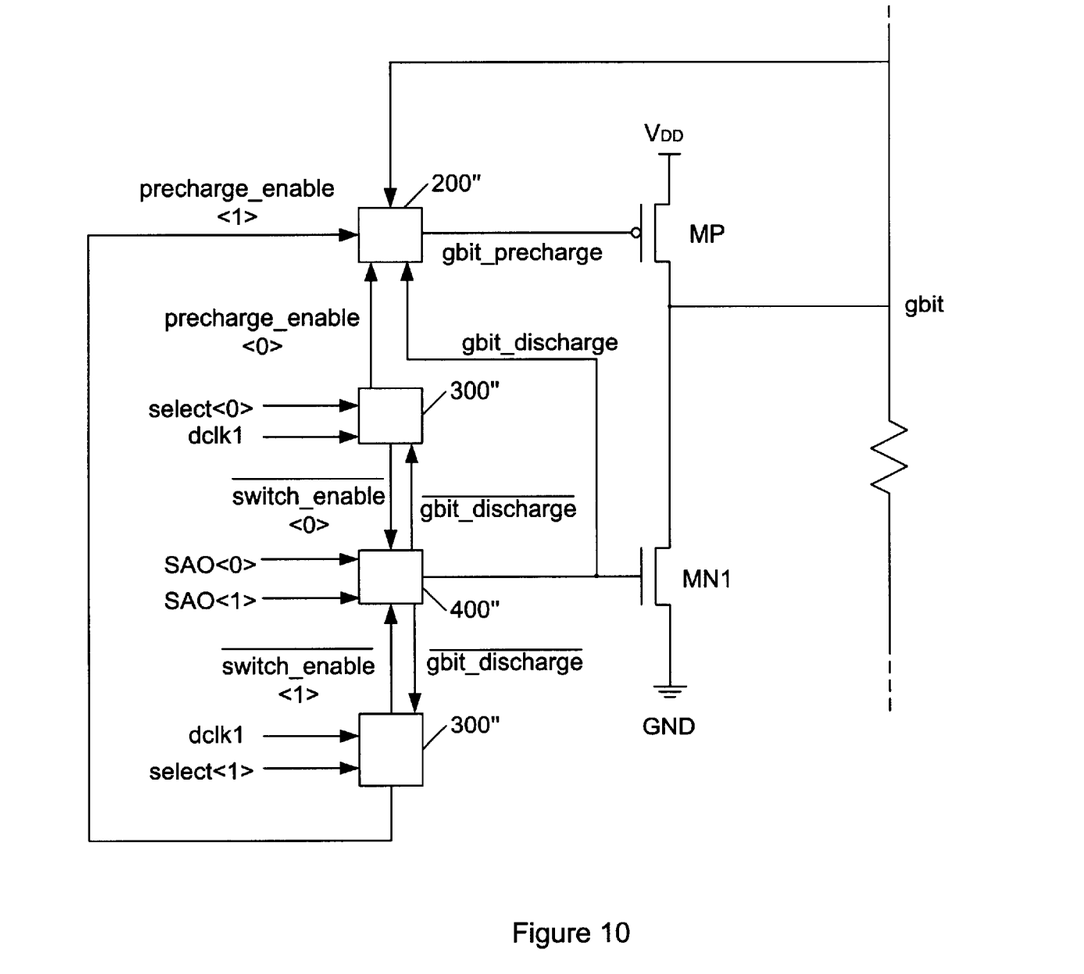
FIG. 10 shows a block diagram of a circuit in accordance with one or more embodiments of the present invention.

Referring to FIGS. 10–13, in one or more embodiments, the present invention may involve other configurations and accept two input lines. For example, FIG. 10 shows an embodiment in which the global bitline (gbit) feedback is provided to the precharge component (200"). Also, the global bitline discharge control signal (gbit_discharge) is fed into the precharge component (200"). Two control circuits (300") are included and switch (400") receives two inputs (SAO<0> and SAO<1>).

Figure 11:
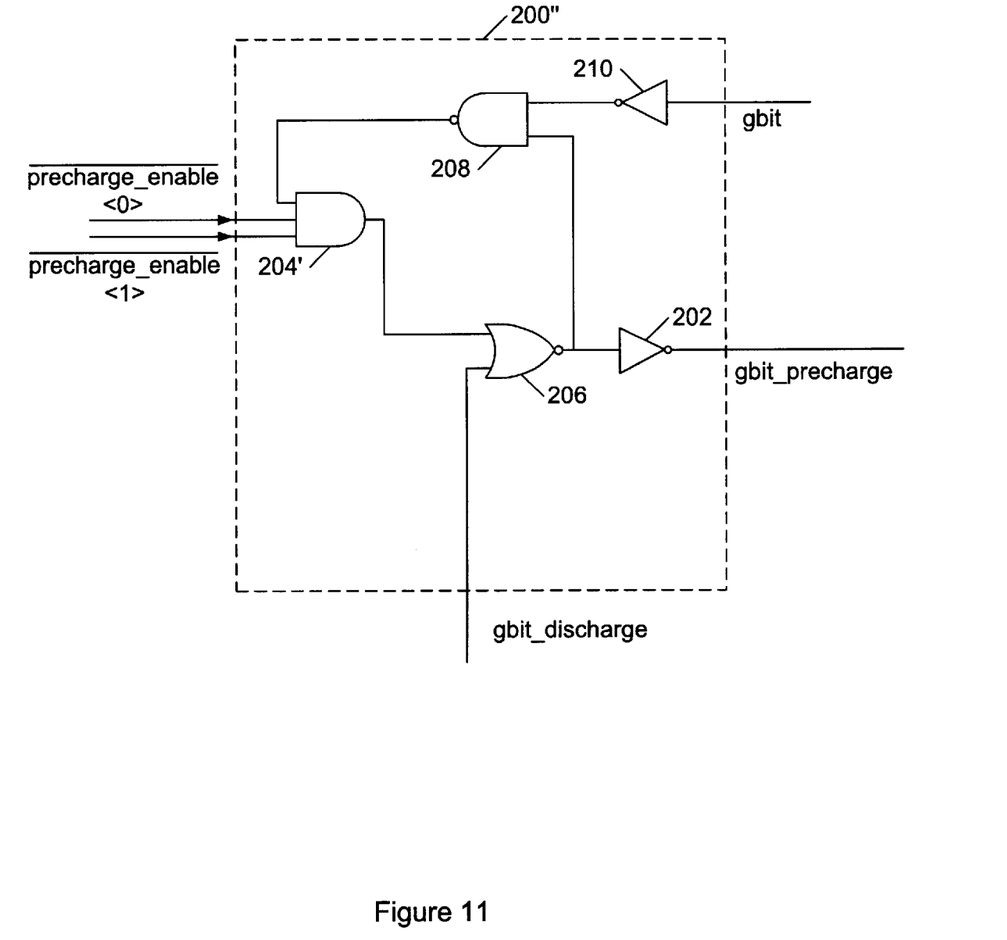
FIG. 11 shows a circuit diagram of a precharge circuit in accordance with one or more embodiments of the present invention.

Referring to FIG. 11, precharge component (200") is similar to the configuration shown in FIG. 7 and includes an inverter (202) connected to the p-channel transistor (MP) as shown in FIG. 10, AND gate (204'), NOR gate (206), NAND gate (208), and inverter (210). However, in this embodiment, AND gate (204') accepts three inputs instead of two.

Figure 12:
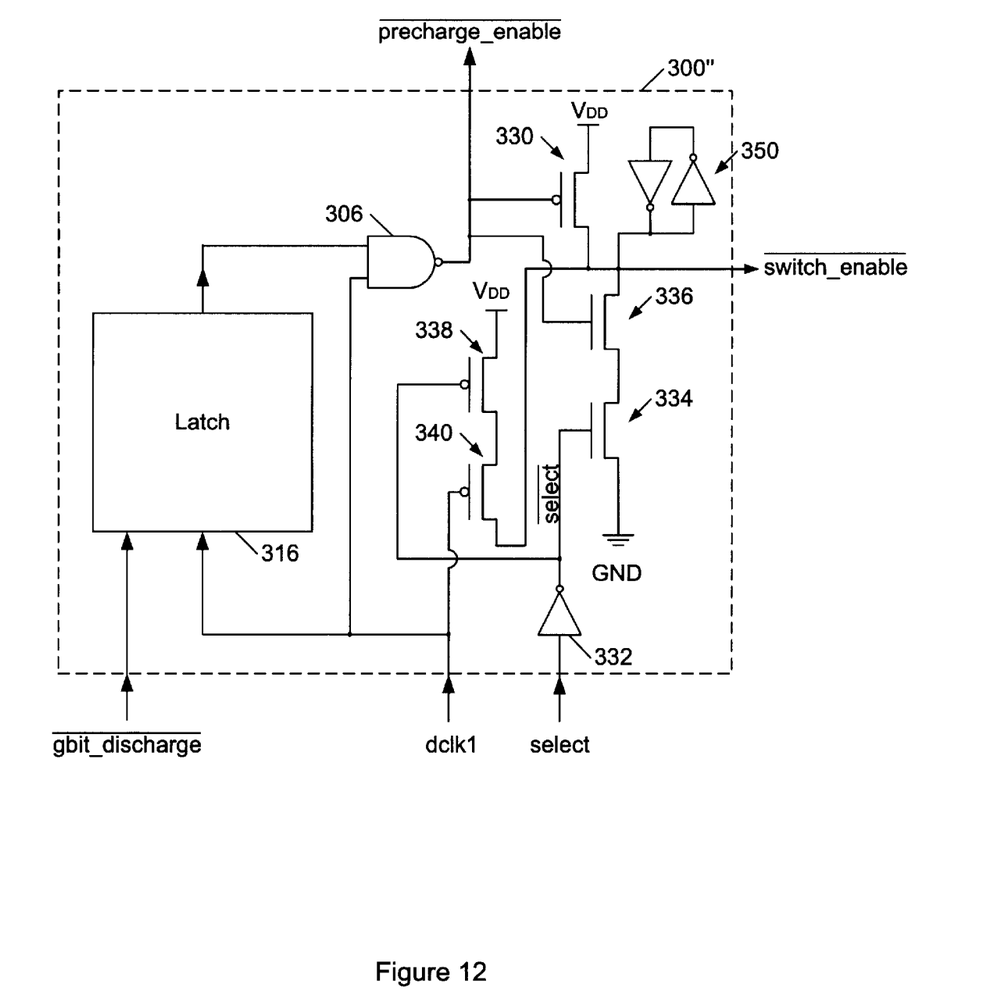
FIG. 12 shows a circuit diagram of a control circuit in accordance with one or more embodiments of the present invention.

Referring to FIG. 12, in the embodiment shown, control circuit (360") includes a NAND gate (306), which produces the complement of precharge control signal (precharge_enable). The output of the NAND gate (306) is also connected to the gate of p-channel transistor (330).

The clock signal (dclk1) is connected to one input of the NAND gate (306) and a glitch latch (316). The glitch latch (316), in turn, is coupled to the other input of the NAND gate (306). The glitch latch (316) may be, for example, similar to that shown in FIG. 7. However, those skilled in the art will appreciate that any latch that converts a dynamic signal to a static signal can be used. The glitch latch (316) also receives the complement of the global bitline discharge control signal (gbit_discharge) provided from switch (400").

P-channel transistor (330) is coupled between supply voltage ($V_{DD}$) and the output of the switch control signal (switch_enable). Also, connected to the output of the switch control signal (switch_enable) are a pair of cross coupled inverters (350) and the drain of n-channel transistor (336). The gate of n-channel transistor (336) receives the output of NAND gate (306). The n-channel transistor (336) is also coupled to n-channel transistor (334), which, in turn, is coupled to ground (GND). The gate of n-channel transistor (334) is coupled to the gate of p-channel transistor (338) and the complement of the input selection control signal (select). The complement of the input selection control signal (select) is obtained by passing the input selection control signal (select) through inverter (332). P-channel transistor (338) is coupled to supply voltage (VDD) and another p-channel transistor (340). The gate of p-channel transistor (340) receives the clock signal (dclk1) and the drain connects to the complement of the switch enable control signal (switch_enable).

Figure 13:
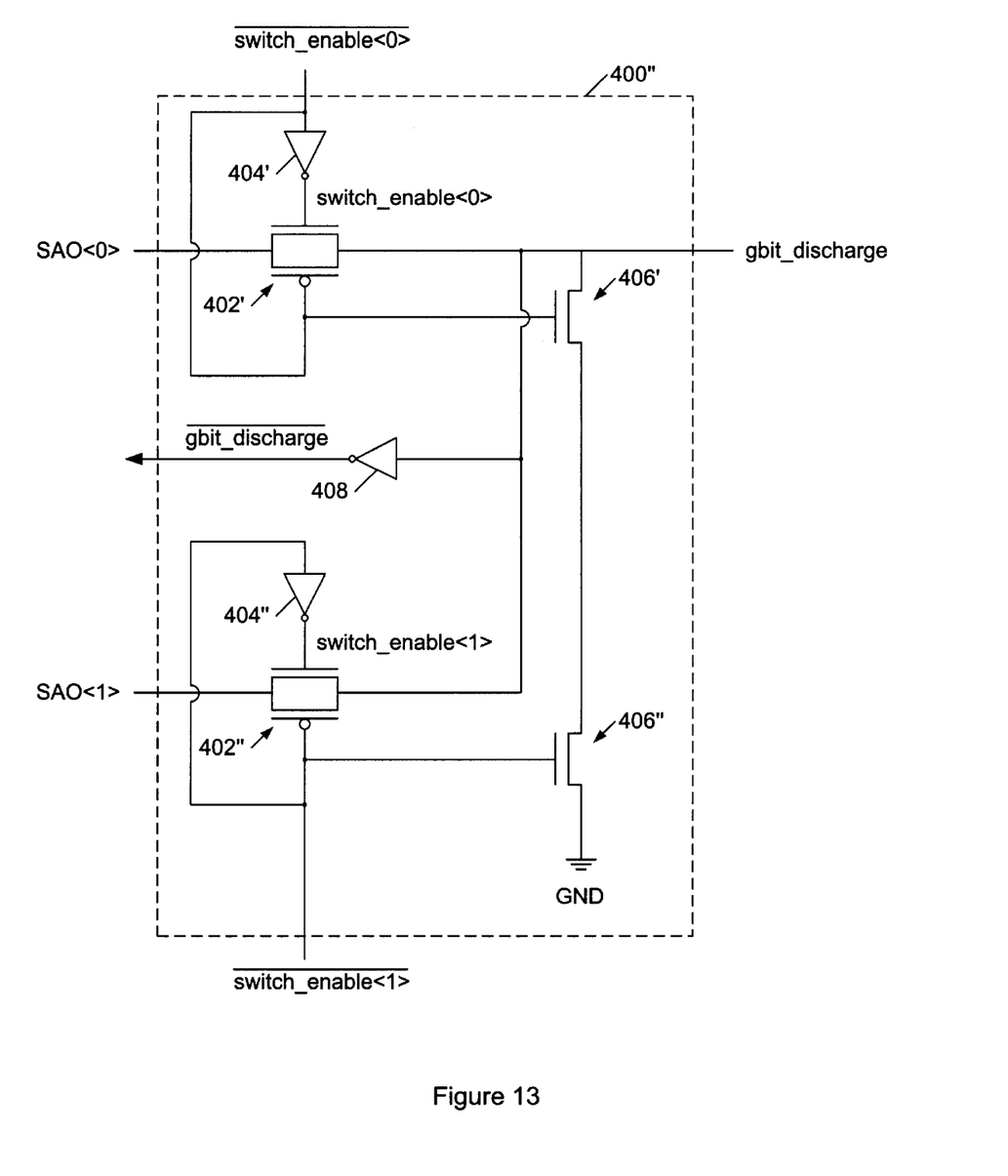
FIG. 13 shows a circuit diagram of a switch in accordance with one or more embodiments of the present invention.

Referring to FIG. 13, switch (400") is essentially similar to the switch (400') shown in FIG. 9, but duplicated in order to handle two inputs. The switch (400") includes a two pass gates (402' and 402"), which respectively control the passing of the sense amplifier outputs (SAO<0> and SAO<1>) to the global bitline discharge control signal (gbit_discharge). The pass gates (402' and 402") are respectively controlled by the appropriate switch control signal (switch_enable<0> and switch_enable<1>) and the complements thereof. In the embodiment shown, an inverter (404' and 404") is used to obtain the switch control signals (switch_enable<0> and switch-enable<1>) respectively.

An n-channel transistor (406') is connected at the gate to the complement of the switch control signal (switch_enable 0>) and the control of the pass gate (402'). Likewise, an n-channel transistor (406") is connected at the gate to the complement of the, switch control signal (switch enable 1>) and the control of the pass gate (402").

The n-channel transistor (406') is also coupled at the drain to the output side of the pass gates (402' and 402") and at the source to n-channel transistor (406"). The n-channel transistor (406") is, in turn, coupled to ground (GND). Also, an inverter (408) is included for producing the complement of the global bitline discharge control signal (gbit_discharge).

Advantages of the present invention may include one or more of the following. The clock skew is not a concern between the time the global bitline discharge ends and the precharge begins because the control circuit does not allow precharge to begin until the discharge ends. As long as the global bitline transitioning low is completed between the global bitline discharge control signal transitioning high and the switch control signal transitioning low, and the global bitline transitioning high is completed between the switch control signal transitioning low and the next sense amplifier output transitioning high minus the clock skew, there is no concern about the skew between when the global bitline discharge control signal transitions low and the global bitline precharge control signal transitions high. Using a glitch latch allows the sense amplifier output to fire later with respect to the clock signal because the glitch latch will pass the sense amplifier output on either edge of the clock. In one or more embodiments, the precharge system may be connected to a long bitline. Even in such cases, clock skew is not a concern.

The pull down stack of the global bitline is now only one device, which reduces the diffusion load on global bitline. Additionally, in situations where the pull down stack was two high, the size of pull down device can now be halved. Even if the sense amplifier output occurs in the a-phase, there is still enough time to discharge and precharge. Thus, the sense amplifier output can be very slow. Of course, the precharge of global bitline must end before the next sense amplifier output. To this end, an extra level of safeguarding is added in one or more embodiments through the feedback of the global bitline. Those skilled in the art will appreciate that the present invention applies also to situations in which the occurrences in the A-phase and B-phase are transposed.

Figure 14:
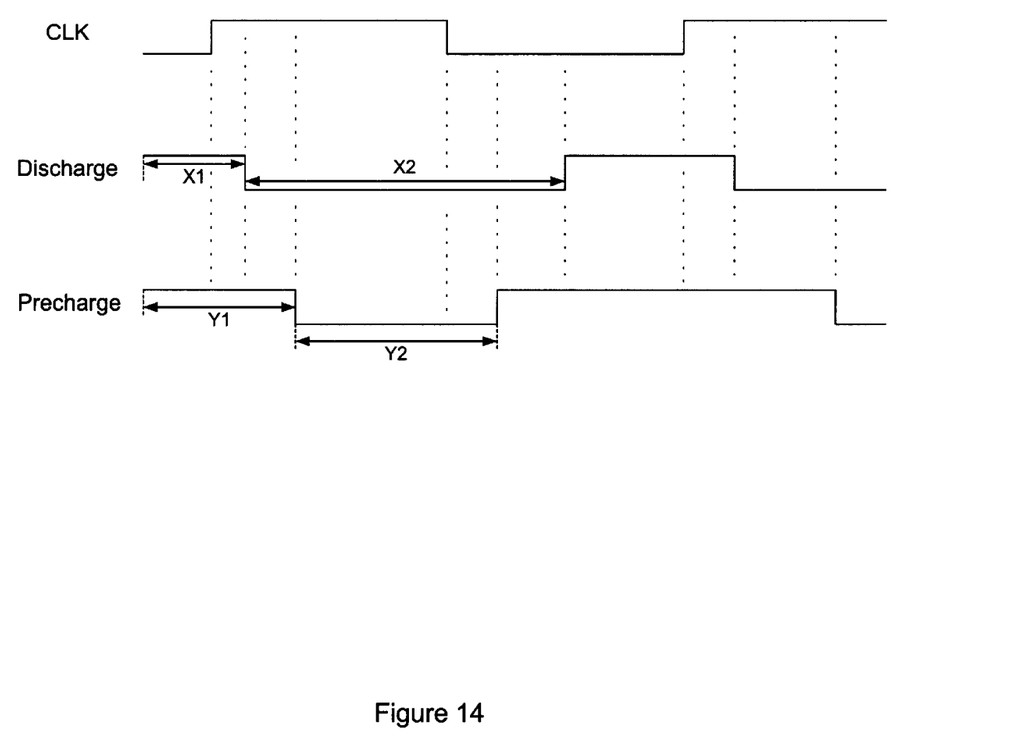
FIG. 14 shows timing diagram of an embodiment of the present invention.

In one or more embodiments, even when the driver and precharge are triggered by different edges of the clock there is no dead time. In simulation, a margin must be added to the number to account for variations in process and modeling. Referring to FIG. 14, a timing diagram of a clock signal, a global bitline discharge control signal, and a global bitline precharge control signal is shown. In order to prevent crowbar current, it must be considered that time (x1) can be longer and time (y1) can be shorter, or time (x2) can be shorter and time (y2) can be longer. In either case, one or more embodiments of the present invention are constructed to eliminate the concern regarding the timing between (x1) and (y1) because (x1) controls (y1).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for minimizing the effect of clock skew in a precharge circuit comprising:

a switch coupled between an input to the precharge circuit and a global bitline; and a control circuit coupled to a precharge component and the switch, wherein the control circuit determines whether the switch and the precharge component are activated, and wherein the control circuit receives feedback from the switch.

2. The system of claim 1 wherein the control circuit receives feedback from the global bitline.

3. The system of claim 1 wherein the precharge component receives feedback from the global bitline.

4. The system of claim 3 wherein the precharge component receives feedback from switch.

5. The system of claim 1, further comprising:

a control signal for pulling an output of the switch low.

6. The system of claim 1, further comprising:

a pair of coupled transistors connect between a pull-up voltage and ground, wherein the precharge component is connected to one of the pair of coupled transistors and the switch is connected to the other of the pair of coupled transistors.

7. A method of minimizing the effect of clock skew in a precharge circuit comprising:

controlling whether an input signal outputting a first signal and a second signal from the precharge circuit;

controlling the outputting of the second signal from the precharge circuit based on feedback of the first signal; and controlling the outputting of the first signal from the precharge circuit based on a clock signal, a select signal, and a dynamic signal.

8. The method of claim 7, further comprising controlling the outputting of the second signal based on feedback from a global bitline.

9. The method of claim 7, further comprising:

pulling an output of a switch low with a control signal.

10. The method of claim 7, further comprising:

a pair of coupled transistors connected between a pull-up voltage and ground, wherein the precharge circuit is connected to one of the pair of coupled transistors and a switch is connected to the other of the pair of coupled transistors.

11. An apparatus for minimizing the effect of clock skew in a precharge circuit comprising:

means for controlling whether an input signal outputting a first signal and a second signal from the precharge circuit;

means for controlling the outputting of the second signal from the precharge circuit based on feedback of the first signal; and means for controlling the outputting of the first signal from the precharge circuit based on a clock signal, a select signal, and a dynamic signal.

12. The apparatus of claim 11, further comprising:

means for controlling the outputting of the second signal based on feedback from a global bitline.

13. A system for minimizing the effect of clock skew in a precharge circuit comprising:

a switch coupled between input to the precharge circuit and a global bitline; and a control circuit coupled to a precharge component and the switch, wherein the control circuit determines whether the switch and the precharge component are activated, wherein the control circuit receives feedback from the switch, and wherein the precharge component receives feedback from the switch and the global bitline.

14. The system of claim 13, wherein the precharge component receives feedback from a first control circuit and a second control circuit.

15. The system of claim 13, further comprising:

a control signal for pulling an output of the switch low.

16. The system of claim 13, further comprising:

a pair of coupled transistors connect between a pull-up voltage and ground, wherein the precharge component is connected to one of the pair of coupled transistors and the switch is connected to the other of the pair of coupled transistors.

17. A system for minimizing the effect of clock skew in a precharge circuit comprising:

a switch coupled between a first input to the precharge circuit and a global bitline and a second input to the precharge circuit and a global bitline;

a first control circuit coupled to a precharge component and the switch, and a second control circuit coupled to a precharge component and the switch, wherein the first control circuit determines whether the switch and the precharge component are activated for the first input, wherein the second control circuit determines whether the switch and the precharge component are activated for the second input, wherein the first control circuit receives feedback from the switch, wherein the second control circuit receives feedback from the switch, and wherein the precharge component receives feedback from the switch and the global bitline.

18. The system of claim 17, further comprising:

a control signal for pulling an output of the switch low.

19. The system of claim 17, further comprising:

a control signal for selecting which of the first input or the second input are output from the precharge circuit.

20. The system of claim 17, further comprising:

a pair of coupled transistors connected between a pull-up voltage and ground, wherein the precharge component is connected to one of the pair of coupled transistors and the switch is connected to the other of the pair of coupled transistors.

* * * * *